(12) United States Patent
Seshan

(10) Patent No.: US 7,034,402 B1
(45) Date of Patent: Apr. 25, 2006

(54) DEVICE WITH SEGMENTED BALL LIMITING METALLURGY

(75) Inventor: Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 09/606,319

(22) Filed: Jun. 28, 2000

(51) Int. Cl.
*H01L 23/48* (2006.01)
*H01L 23/52* (2006.01)
*H01L 29/40* (2006.01)

(52) U.S. Cl. .................. 257/781; 257/737; 257/774
(58) Field of Classification Search ............. 257/737, 257/774, 781
See application file for complete search history.

(56) References Cited

U.S. PATENT DOCUMENTS

| | | | |
|---|---|---|---|
| 4,223,337 A | 9/1980 | Kojima et al. | |
| 5,410,184 A | 4/1995 | Melton et al. | |
| 5,426,266 A * | 6/1995 | Brown et al. | 174/267 |
| 5,492,235 A | 2/1996 | Crafts et al. | |
| 5,674,780 A | 10/1997 | Lytle et al. | |
| 5,847,466 A * | 12/1998 | Ito et al. | 257/775 |
| 5,854,513 A * | 12/1998 | Kim | 257/734 |
| 6,179,200 B1* | 1/2001 | Kung et al. | 228/174 |
| 6,404,051 B1* | 6/2002 | Ezawa et al. | 257/734 |
| 6,464,122 B1* | 10/2002 | Tadauchi et al. | 228/1.1 |
| 6,577,017 B1* | 6/2003 | Wong | 257/786 |
| 6,613,662 B1* | 9/2003 | Wark et al. | 438/613 |

FOREIGN PATENT DOCUMENTS

| | | | | |
|---|---|---|---|---|
| JP | 54043675 | 4/1979 | | |
| JP | 57106056 | 7/1982 | | |
| JP | 60007758 | 1/1985 | | |
| JP | 61049452 | 3/1986 | | |
| JP | 62176140 | 8/1987 | | |
| JP | 03019248 | 1/1991 | | |
| JP | 05013418 | 1/1993 | | |
| JP | 05166814 | * | 7/1993 | .............. 257/737 |
| JP | 05206198 | 8/1993 | | |
| JP | 07335679 | 12/1995 | | |
| JP | 09082714 | 3/1997 | | |
| JP | 08204136 | 8/1998 | | |
| JP | 10270484 | 10/1998 | | |
| WO | WO 99/34423 | 7/1999 | | |

OTHER PUBLICATIONS

Webster's II new Riverside University Dictionary, 1994 edition, Riverside Pub., p. 1056.*
International Search Report PCT/US 01/18750.

\* cited by examiner

*Primary Examiner*—Howard Weiss
(74) *Attorney, Agent, or Firm*—George Chen

(57) ABSTRACT

The present invention discloses a novel layout and process for a device with segmented BLM for the I/Os. In a first embodiment, each BLM is split into two segments. The segments are close to each other and connected to the same overlying bump. In a second embodiment, each BLM is split into more than two segments. In a third embodiment, each segment is electrically connected to more than one underlying via. In a fourth embodiment, each segment is electrically connected to more than one underlying bond pad.

14 Claims, 5 Drawing Sheets

DEVICE WITH SEGMENTED BALL LIMITING METALLURGY

BACKGROUND OF THE INVENTION

1. Field of the Invention

The present invention relates to the field of semiconductor Integrated Circuits (IC), and more specifically, to a layout and process for a device with segmented Ball Limiting Metallurgy (BLM) for the Inputs/Outputs (I/Os).

2. Discussion of Related Art

I/Os are used in a device to condition and distribute power, ground, and signals. The I/Os can be wirebonded to a package or board with leads formed from Gold (Au) or Copper (Cu) wire. However, when the number of I/Os reaches about 400 to 1000, bumping often becomes more advantageous than wirebonding.

FIG. 1(a) and FIG. 1(b) show a solder bump 15 with a diameter 1 and a pitch 2. The solder bump 15 is formed on Ball Limiting Metallurgy (BLM) 14. BLM is also known as Pad Limiting Metallurgy (PLM) or Under Bump Metallurgy (UBM). The BLM 14 is connected through a via 12 in the passivation layer 13 to an underlying bond pad 11b. The passivation layer 13, comprises one or more layers of materials, such as silicon oxide, silicon nitride, or polyimide, which act as a barrier to moisture, ions, or contaminants. The bond pad 11b is a widened portion of a metal line 11a in the top metal layer of the device. The line 11a is connected to an underlying via 10 that is, in turn, connected to an underlying line 9. A device typically has 2 to 8 metal layers so a via and a line are alternated vertically until electrical contact is made to the desired part of the IC or the substrate below.

Bumping can significantly improve access to the core area and maximize utilization of the silicon area. FIG. 1 (a) and FIG. 1 (b) show an areal array 3 of bumps 15 across the entire active area of the chip. The array 3 is substantially periodic and may be face-centered cubic or hexagonal to achieve a higher density of bumps 15. A bumped device is turned over and packaged as a Flip Chip (FC). A solder bump technology based on Controlled Collapse Chip Connection (C4) may be used for Direct Chip Attach (DCA) to conductive traces on a package or circuit board. The circuit board may be a ceramic substrate, Printed Wiring Board (PWB), flexible circuit, or a silicon substrate. Bumping a device also reduces the resistance and inductance in the I/Os thus significantly improving performance.

A high performance device, such as a microprocessor, an Application Specific Integrated Circuit (ASIC), a Field Programmable Gate Array (FPGA), or a System-on-a-Chip (SOC), may have about 600 to 7000 I/Os so the I/Os need to be scaled down to limit die size. Wirebonding may involve a pitch of less than 60 microns using wires with a diameter of less than 25 microns with ball bonds of less than 40 microns. Bumping may involve bumps with a diameter of about 45 to 90 microns and a pitch of about 125 to 300 microns.

Power management and thermal management become very critical when wire leads or bumps are scaled down. I/Os may fail if junction temperature exceeds 100 to 125 degrees C. or current density exceeds 150 to 425 milliamperes per I/O. Electromigration or thermomigration can increase resistance by over 2 orders of magnitude before finally resulting in an open circuit. Elevated temperatures can also cause inter-diffusion of metals. The resultant intermetallic alloys are brittle and may be susceptible to stress cracking. A mismatch in the Coefficient of Thermal Expansion (CTE) can result in large shear stresses on a wire lead or bump. For example, solder has a CTE of about 30 ppm/degree C. compared with about 7 ppm/degree C. for a ceramic substrate and about 5 ppm/degree C. for a Silicon substrate. A wire lead or bump may fail from thermal shock if the thermal ramp rate exceeds about 15 to 20 degrees C./minute. Thermal cycling at lower thermal ramp rates may also cause a wire lead or bump to crack due to fatigue induced by elastic deformation or creep deformation.

Thus, the failure of I/Os, especially the power I/Os, due to high currents and high temperatures is a major concern.

Thus, what is needed is a novel layout and process for a device with segmented Ball Limiting Metallurgy (BLM) for the I/Os.

BRIEF DESCRIPTION OF THE DRAWINGS

The present invention is illustrated by way of example and not limitation in the figures of the accompanying drawings in which like references indicate similar elements and in which.

DETAILED DESCRIPTION OF THE PRESENT INVENTION

The present invention discloses a novel layout and process for a device with segmented Ball Limiting Metallurgy (BLM) for the Inputs/Outputs (I/Os). The invention further discloses that a segment of a BLM may be electrically connected to more than one underlying via or bond pad. The invention can reduce the incidence and minimize the severity of I/O failure due to operation at high current and high temperature.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid unnecessarily obscuring the present invention.

The layout of the device in the present invention will be described first.

Figures 1A, 1B:
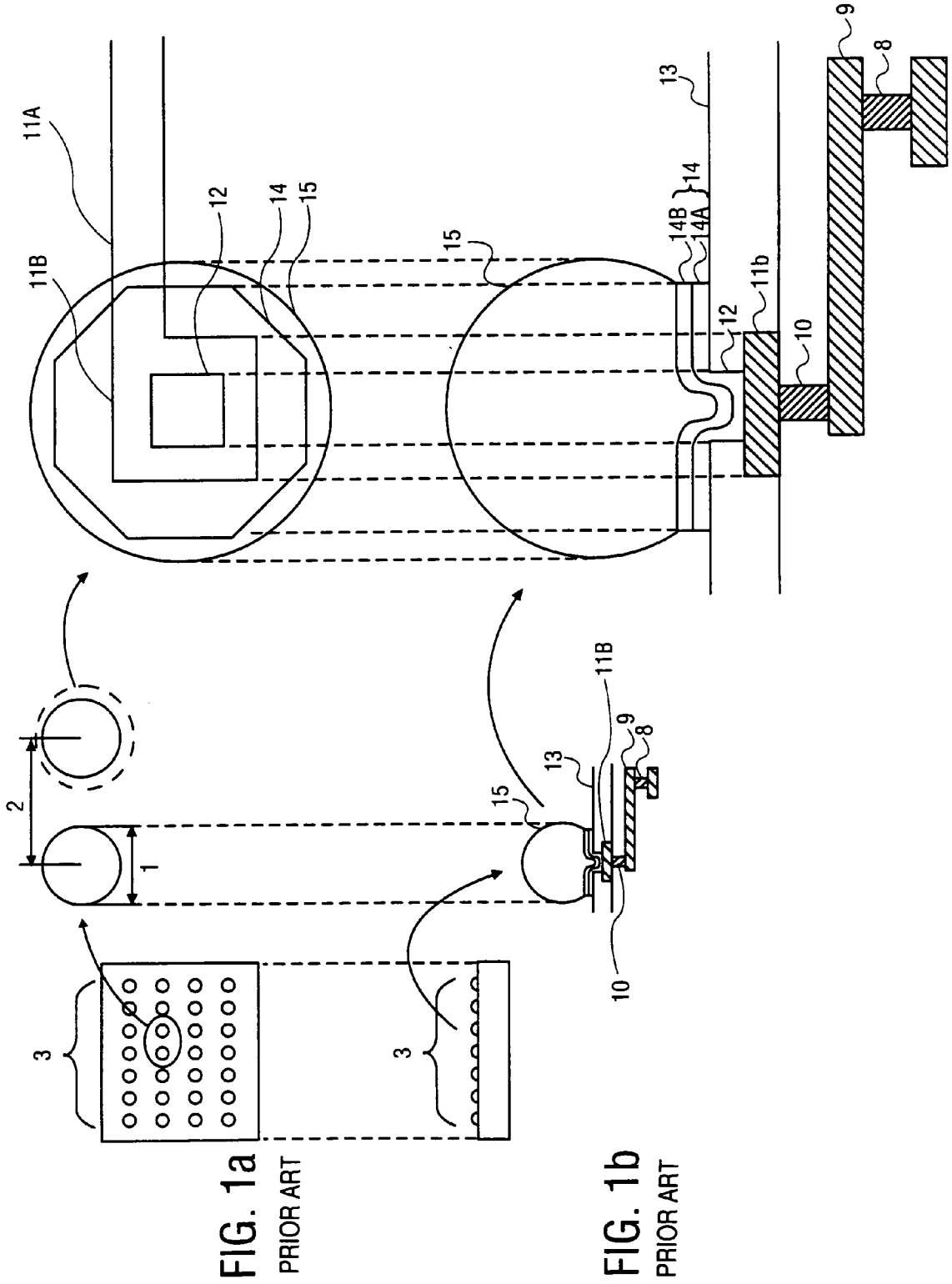
FIG. 1(a) is an illustration of a plane view of a bump (prior art).
FIG. 1(b) is an illustration of a cross-sectional view of a bump (prior art).
Figure 2A:
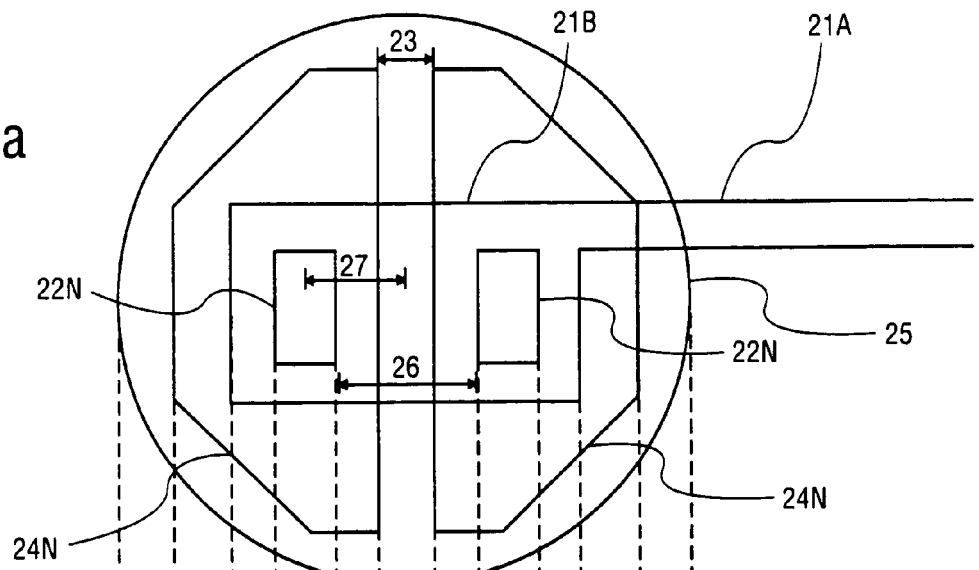
FIG. 2(a) is an illustration of a plane view of a bump connected to a BLM with two segments.
Figure 2B:
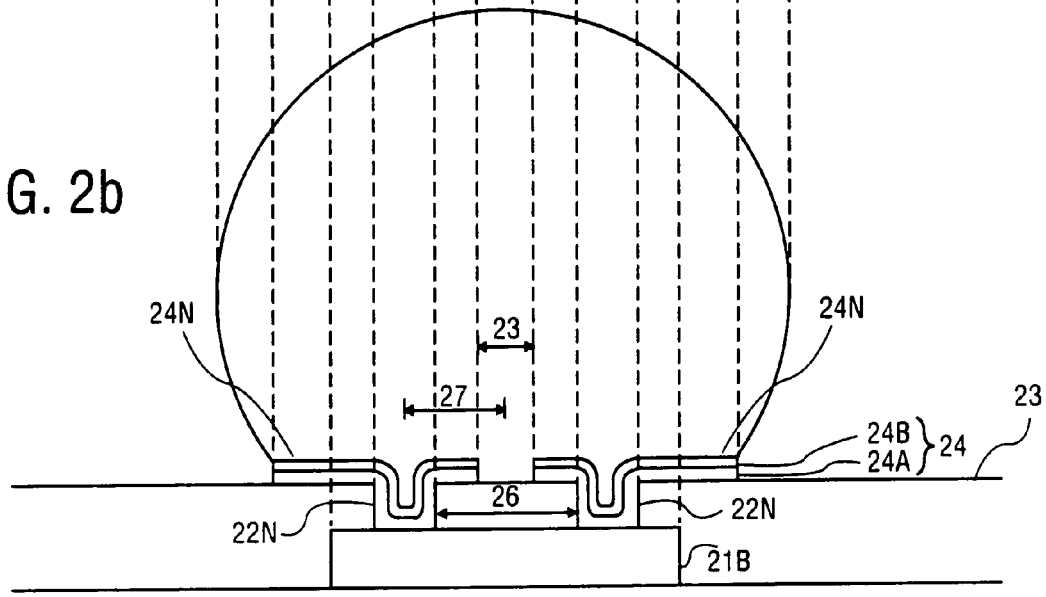
FIG. 2(b) is an illustration of a cross-sectional view of a bump connected to a BLM with two segments.

According to a first embodiment of the present invention, a BLM is split into two segments 24n as shown in FIG. 2(a) and FIG. 2(b). One or more of the segments 24n may have a substantially polygonal layout, such as a hexagon or an octagon. The segments 24n are in close proximity to each other. The gap 23 between the segments 24n will block the propagation of a defect arising in any individual segment 24n. The segments 24n also provide redundancy to counteract defects that may occur randomly in the segments 24n.

Both segments 24n are connected to the same overlying bump 25 as shown in FIG. 2(a) and FIG. 2(b). Each segment 24n is also connected to one underlying via 22n. One or more of the vias 22n may have a substantially polygonal layout, such as a square or a rectangle. The vias 22n are in close proximity to each other. The spacing 26 between the vias 22n will block the propagation of a defect arising in any individual via 22n. The vias 22n also provide redundancy to counteract defects that may occur randomly in the vias 22n. One or more of the vias 22n may be laterally offset 27 from the overlying bump 25 to which they are electrically connected. Both vias 22n are connected to the same underlying bond pad 21b. The bond pad 21b is a portion of the underlying line 21a that has been widened to ensure that the via 22n will make full contact with the line 21a despite any misalignment.

Figure 3:
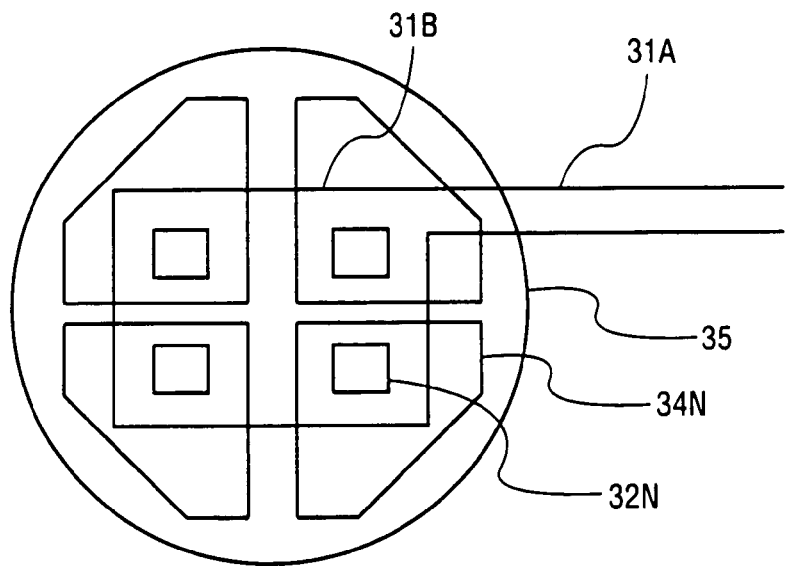
FIG. 3 is an illustration of a plane view of a bump connected to a BLM with four segments.

According to a second embodiment of the present invention, a BLM may be split into more than two segments, such as the four segments 34n shown in FIG. 3. All four segments 34n are connected to the same overlying bump 35. Each segment 34n is connected to an underlying via 32n. All four vias 32n are connected to the same underlying line 31a at the bond pad 31b.

Figure 4:
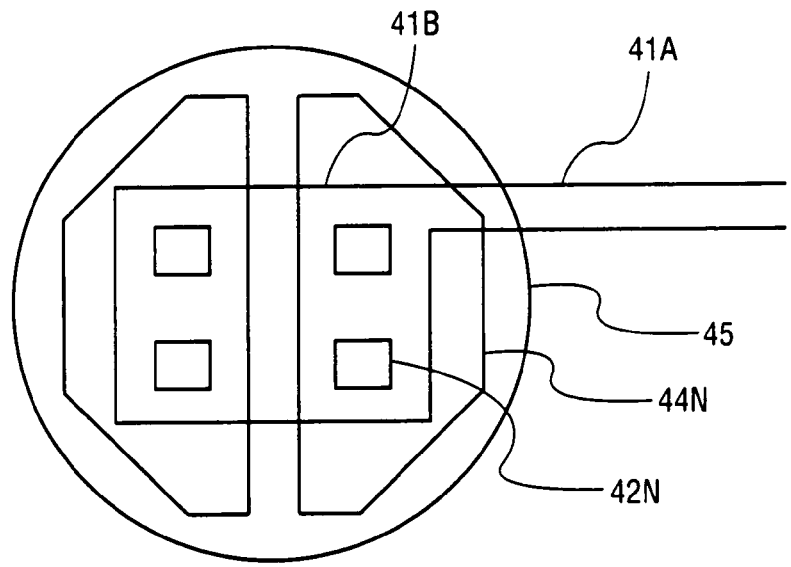
FIG. 4 is an illustration of a plane view of a bump connected to a BLM with two segments where each segment is connected to two vias.

According to a third embodiment of the present invention, each segment 44n of a BLM may be connected to more than one via 42n, such as the two vias 42n shown in FIG. 4.

Figure 5:
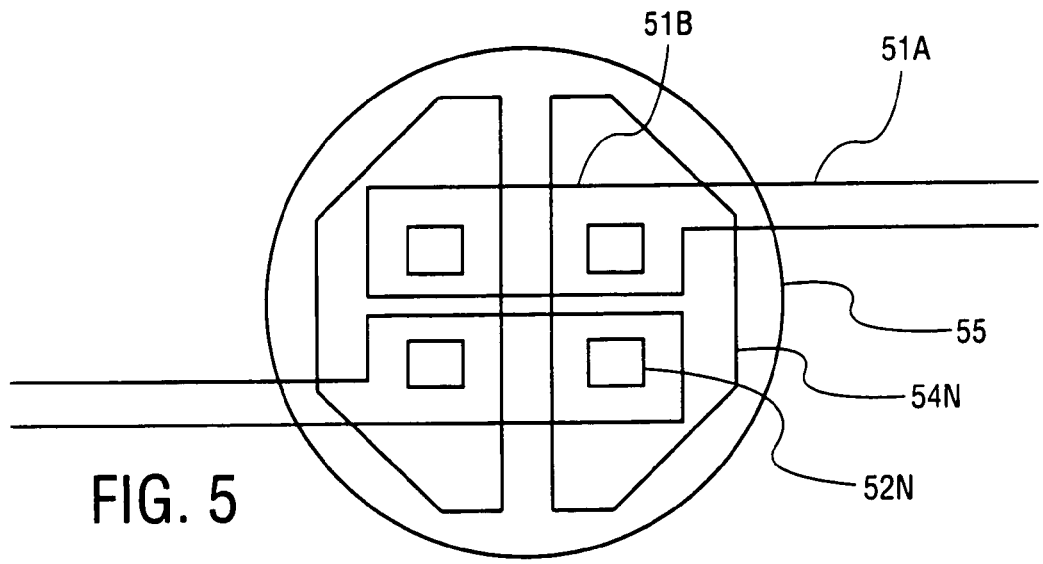
FIG. 5 is an illustration of a plane view of a bump connected to a BLM with two segments where each segment is connected to two bond pads.

According to a fourth embodiment of the present invention, each segment 54n of a BLM may be connected to more than one bond pad 51b, such as the two bond pads 51b shown in FIG. 5.

The process to form the segmented BLM of the present invention will be described next.

Figure 6A:
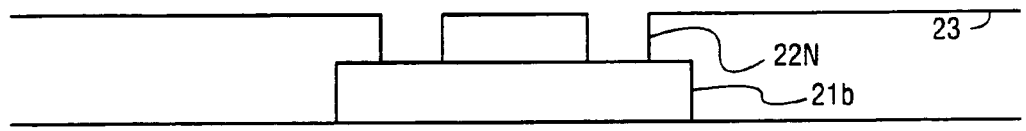
FIGS. 6(a)–(f) are illustrations of an embodiment of a process for forming segmented BLM.
Figure 6B:
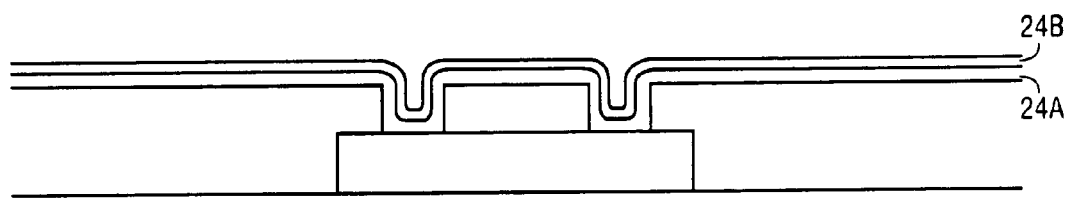

First, the passivation layer 23 is patterned to form vias 22n to expose the bond pad 21b as shown in FIG. 6(a). The patterning can be done with photoresist or with photodefinable polyimide.

Next, BLM is formed, usually by sputtering. The BLM usually has a lower layer 24a and an upper layer 24b as shown in FIG. 6 (b). The lower layer 24a provides good adhesion to the landing pad 21b and the passivation layer 23. The lower layer 24a may be formed from Titanium (Ti) with a thickness of about 200 to 1500 Angstroms. Other possible metals for the lower layer 24a include Titanium-Tungsten (TiW), Tantalum (Ta), Chromium-Copper (Cr—Cu), or Chromium (Cr). The upper layer 24b provides good adhesion to the lower layer 24a and is wettable by solder. The upper layer 24b may be formed from Nickel-Vanadium (Ni—V) with a thickness of about 1000 to 8000 Angstroms. Other possible metals for the upper layer 24b include Nickel (Ni), Chromium-Copper (Cr—Cu), Copper (Cu), Gold (Au), Nickel-Gold (Ni—Au), or Copper-Gold (Cu—Au).

The lower layer 24a and the upper layer 24b of the BLM act as diffusion barriers to metals. However, depending on the type of metallurgy selected for the bump 25 and the BLM, additional layers may be inserted between the lower layer 24a and the upper layer 24b to further prevent interdiffusion of metals. Any intermediate layer used must have good adhesion to both the lower layer 24a and the upper layer 24b. Depending on the metals used in the upper layer 24b, a capping layer, such as Copper (Cu) or Gold (Au), may also be used over the upper layer 24b to prevent oxidation or corrosion of the upper layer 24b.

Figure 6C:
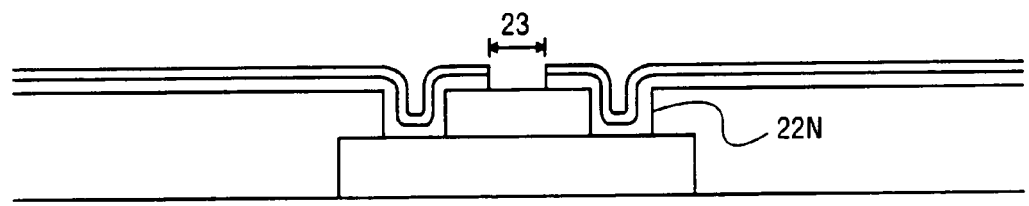
Figure 6D:
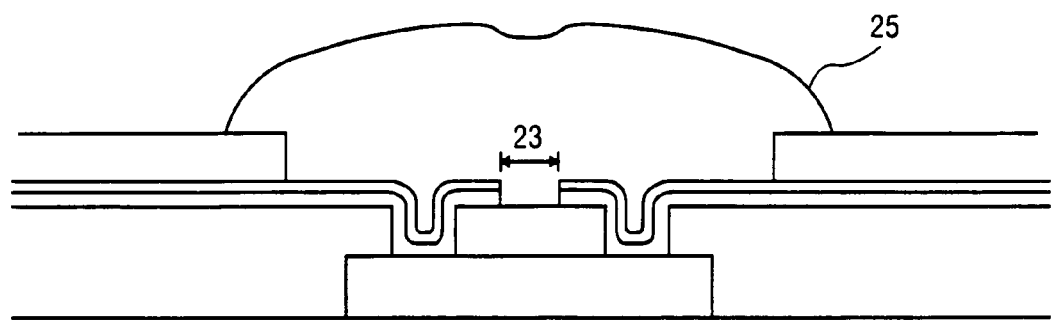

Photoresist is applied and patterned so a gap 23 can be etched in the BLM between the vias 22n as shown in FIG. 6(c). After stripping the photoresist, another layer of photoresist is applied and patterned so solder 25 can be electroplated onto the BLM as shown in FIG. 6(d). The solder may be formed from Lead-Tin (Pb—Sn) or Lead-Indium (Pb—In). Tin prevents oxidation and strengthens the bonding to the BLM.

The solder in the openings of the photoresist will straddle the gap 23 between the vias 22n, merge, and eventually rise above the photoresist to become mushroom-shaped, as shown in FIG. 6(d). The height of the photoresist and the pitch of the openings for the bumps must be well-controlled to produce a consistent solder height. Uniformity of solder height and alloy composition also depend on the current density distribution across the wafer and several parameters in the plating solution. Solder voiding can result from generation and entrapment of hydrogen gas and plating solution within the plated solder and must be prevented.

Figure 6E:
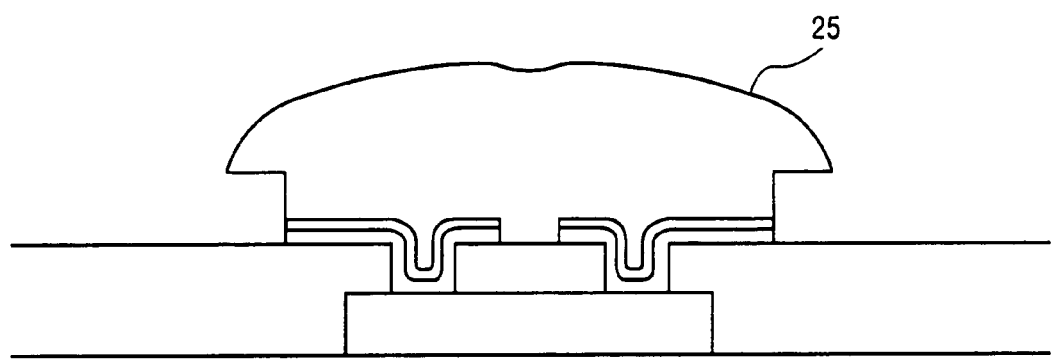
Figure 6F:
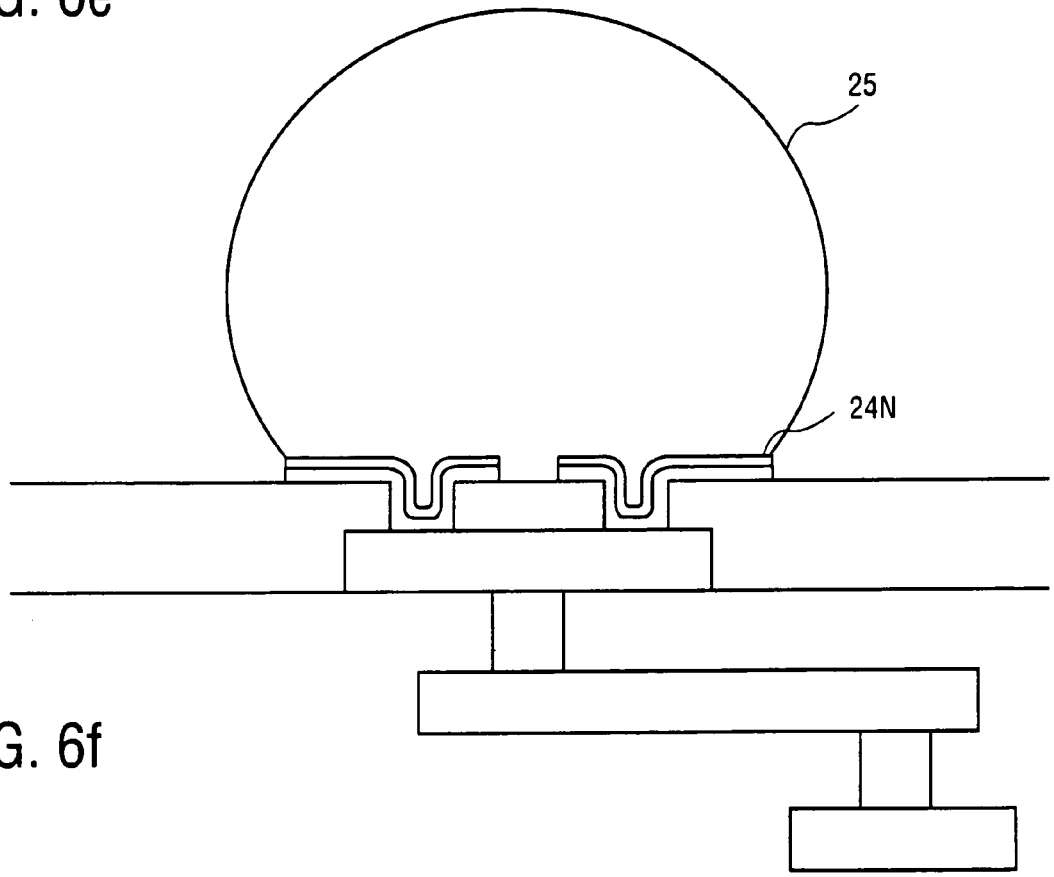

Excess portions of the upper layer 24b and the lower layer 24a which are not covered by solder 25 are removed by etching, as shown in FIG. 6(e). Heating in an oven or a furnace will reflow the solder sitting on the segments 24n of the BLM into a single bump 25 as shown in FIG. 6(f). The melting temperature of the solder in the bump 25 on the chip depends on the types of metals selected and their relative concentrations. For example, a high Lead solder, such as 95 Pb/5 Sn by weight percent, reflows at about 300 to 360 degrees C. while a eutectic solder, such as 37 Pb/63 Sn, reflows at about 180 to 240 degrees C.

The bump 25 on the chip can be connected to a corresponding bump on a package or board. The bump on the package or board is formed from Tin (Sn) or solder with a relatively low melting temperature, such as 160 degrees C., so the bump 25 on the chip will not reflow during the chip attachment process.

Segmented BLM is compatible with other process flows used to form bumps for the I/Os. A few examples will be mentioned here. Electroless plating of Nickel (Ni) does not require a mask but requires that an intermediate layer, such as Zinc (Zn), be plated first on the Aluminum (Al) line. Conductive pillars surrounded by non-conductive dielectric may be used to electroplate the solder. Solder dams or solder stops may be used during reflow to limit the spreading of the bumps. The solder ball may be reflowed before the excess BLM is etched away to minimize undercutting of the BLM under the bump 25. The upper layer 24b and the lower layer 24a of the BLM do not have to be etched sequentially. The BLM may be protected by photoresist during etch.

Segmented BLM is also compatible with other materials used for the bumps. A low alpha particle solder may be desirable to prevent soft errors. Alpha emission should be less than 0.02 count/hour/cm$^2$ in sensitive semiconductor devices such as memory chips. Environmental concerns require the elimination of metallic Lead (Pb) from solder by about the year 2004. A bump which is free of Lead (Pb) may be formed from Alternate Ball Metallurgy (ABM). ABM includes binary, ternary, and quaternary alloys formed from metals, such as Tin (Sn), Silver (Ag), Copper (Cu), Antimony (Sb), Indium (In), and Cadmium (Cd). An example is a Tin-Silver-Copper (Sn—Ag—Cu) ternary alloy with a melting point of about 215 degrees C. Other examples include a Tin-Copper (Sn—Cu) binary alloy or a Tin-Silver (Sn—Ag) binary alloy.

Solder itself may be eliminated by stencil printing the bumps from an Electrically Conductive Adhesive (ECA) or paste. ECAs include epoxy resin with a filler of conductive particles, such as Silver-filled epoxy. The electrical conductivity may be isotropic or anisotropic. ECAs are useful for thermally sensitive devices since a temperature of less than about 160 degrees C. is needed to cure the adhesive by polymerizing the resin binder. ECAs have some disadvantages relative to solder bumps. Contact resistance of ECAs is about 25 micro-ohm which is higher than the 10 micro-ohm for solder. ECAs also have low thermal conductivities of about 1 to 3 W/mK so the device must operate at low power. However, electrically conductive polymers are being developed with thermal conductivities of about 60 W/mK which would be competitive with solder.

Various embodiments of a device with segmented BLM and the accompanying process to accomplish such a device have been described. The above embodiments refer to a bump overlying the segmented BLM. However, the present invention also contemplates a wire lead overlying a segmented bond pad. In that case, a wire bonder is modified to attach a wire lead to two or more segments of a bond pad so as to achieve similar beneficial reductions in incidence and severity of I/O failure.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a novel layout and process for a device with segmented BLM for the I/Os.

We claim:

1. A device having Input/Output (I/O) connections comprising:
   a bond pad;
   a passivation layer disposed over said bond pad;
   vias disposed in said passivation layer to uncover said bond pad;
   a BLM disposed over said vias, said BLM split into two or more segments, said segments in close proximity to each other, said segments separated by a gap, each of said segments connected to two or more of said vias; and
   a bump disposed directly on said segments and in said vias.

2. The device of claim 1 wherein said bump comprises a Lead-Tin (Pb—Sn) solder.

3. The device of claim 1 wherein said bump is free of Lead (Pb).

4. The device of claim 1 wherein said bump comprises a ternary alloy comprising Tin-Silver-Copper (Sn—Ag—Cu).

5. The device of claim 1 wherein said bump comprises an Electrically Conductive Adhesive (ECA).

6. The device of claim 1 wherein said BLM provides a diffusion barrier to metals.

7. The device of claim 1 wherein said BLM comprises a lower layer and an upper layer.

8. The device of claim 7 wherein said lower layer comprises Titanium (Ti) with a thickness of about 200 to 1500 Angstroms.

9. The device of claim 7 wherein said upper layer comprises Nickel-Vanadium (Ni—V) with a thickness of about 1000 to 8000 Angstroms.

10. The device of claim 1 wherein said segments comprise a substantially polygonal layout.

11. The device of claim 1, wherein said vias are laterally offset from a center of said bump to which they are electrically connected.

12. The device of claim 1 wherein said vias comprise a substantially polygonal layout.

13. The device of claim 1, further comprising another bond pad, wherein each of said segments is electrically connected to said bond pad and said another bond pad.

14. The device of claim 13 wherein said bond pad and said another bond pad are laterally offset from a center of said bump to which they are electrically connected.

* * * * *